United States Patent
Kakinuma et al.

(10) Patent No.: US 8,019,315 B2
(45) Date of Patent: Sep. 13, 2011

(54) MIXER AND FREQUENCY CONVERTING APPARATUS

(75) Inventors: Yuji Kakinuma, Tokyo (JP); Ryoichi Kondo, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/787,704

(22) Filed: May 26, 2010

(65) Prior Publication Data

US 2010/0301919 A1 Dec. 2, 2010

(30) Foreign Application Priority Data

May 28, 2009 (JP) .................. 2009-128615

(51) Int. Cl.
*H04B 1/26* (2006.01)
(52) U.S. Cl. .................. 455/323; 455/326; 327/356
(58) Field of Classification Search .................. 455/113, 455/313, 323, 326, 330, 333; 327/113, 116, 327/119, 355, 356
See application file for complete search history.

(56) References Cited

U.S. PATENT DOCUMENTS

| | | | |
|---|---|---|---|
| 6,947,316 B2 * | 9/2005 | Takahashi et al. | 365/158 |
| 7,808,229 B2 * | 10/2010 | Koga et al. | 324/117 R |
| 7,825,658 B2 * | 11/2010 | Koga et al. | 324/252 |
| 2009/0243698 A1 * | 10/2009 | Kakinuma et al. | 327/356 |

OTHER PUBLICATIONS

A.A. Tulapurkar et al., "Spin-torque diode effect in magnetic tunnel junctions", Nature Publishing Group, vol. 438/17 Nov. 2005,, pp. 339-342.
Y. Suzuki et al., "Microwave Properties of Spin Injection Devices", vol. 2, No. 6, 2007,, pp. 282-290, with a partial English language translation.

* cited by examiner

*Primary Examiner* — Long Nguyen
(74) *Attorney, Agent, or Firm* — Greenblum & Bernstein, P.L.C.

(57) ABSTRACT

A mixer includes a magnetoresistive effect element, a magnetic field applying unit, and an impedance circuit. The magnetoresistive effect element includes a fixed magnetic layer, a free magnetic layer, and a nonmagnetic spacer layer disposed between the fixed magnetic layer and the free magnetic layer, is operable when a first high-frequency signal and a second high-frequency signal as a local signal are inputted, to multiply the first high-frequency signal and the second high-frequency signal according to a magnetoresistive effect to generate a multiplication signal. The magnetic field applying unit applies a magnetic field to the free magnetic layer. The impedance circuit has a higher impedance for the multiplication signal than an impedance for the first high-frequency signal and the second high-frequency signal and is disposed between an input transfer line, which transfers the first high-frequency signal and the second high-frequency signal, and the magnetoresistive effect element.

13 Claims, 8 Drawing Sheets

MIXER AND FREQUENCY CONVERTING APPARATUS

BACKGROUND OF THE INVENTION

1. Field of the Invention

The present invention relates to a mixer that generates a multiplication signal using a magnetoresistive effect element and a frequency converting apparatus equipped with such mixer.

2. Description of the Related Art

A TMR (Tunnel MagnetoResistive) element constructed with a spacer layer formed of a nonmagnetic material between a fixed magnetic layer and a free magnetic layer is known as one example of a magnetoresistive effect element. In a TMR element, spin-polarized electrons flow when a current passes, and the magnetic orientation of the free magnetic layer (i.e., the orientation of electron spin) changes in accordance with the number of spin-polarized electrons that accumulate inside the free magnetic layer. When an attempt is made to change the magnetic orientation of a free magnetic layer that has been disposed in a certain magnetic field, torque will act upon the electron spin so as to restore the electron spin to a stable orientation that is restricted by the magnetic field, and when the electron spin is perturbed with a specific force, oscillation referred to as spin precession will occur.

In recent years, a phenomenon called spin torque ferromagnetic resonance has been discovered whereby when a high-frequency AC current flows in a magnetoresistive effect element such as a TMR element, strong resonance will occur if the frequency of the AC current that flows through the free magnetic layer matches the oscillation frequency of the spin precession that is attempting to restore the magnetic orientation (see non-Patent Document 1). It is also known that when an RF current (i.e., an RF current with a frequency that matches the oscillation frequency (resonant frequency) of the spin precession) is injected into a magnetoresistive effect element in a state where a static magnetic field is being applied to the magnetoresistive effect element from outside and the orientation of the static magnetic field is inclined by a predetermined angle in the fixed magnetic layer to the magnetic orientation of the fixed magnetic layer, the magnetoresistive effect element will function so that a DC voltage in proportion to the square of the amplitude of the injected RF current is generated across both ends of the magnetoresistive effect element, or in other words, a square-law detection function (or the so-called spin torque diode effect) is achieved. It is also known that the square-law detection output of such magnetoresistive effect element will exceed the square-law detection output of a semiconductor pn junction diode under predetermined conditions (see Non-Patent Document 2).

Non-Patent Document 1
  "Nature", Vol. 438, 17 Nov. 2005, pp. 339-342
Non-Patent Document 2
  "Magune", Vol. 2, No. 6, 2007, pp. 282-290

In spite of the above phenomenon of TMR elements being known, no magnetic devices that can put such phenomenon to industrial use are known, and application of such discovery is awaited. By carrying out thorough research, the present applicant focused on the square-law detection function of a magnetoresistive effect element, investigated and already proposed its application in a mixer capable of operating on low local power (see Japanese Patent Application No. 2008-89569).

SUMMARY OF THE INVENTION

However, the present applicant continued investigating the proposed mixer mentioned above and found a phenomenon whereby when the impedance of the transfer line (signal line) that is connected to the magnetoresistive effect element is low (for example, when the magnetoresistive effect element is directly connected to a transfer line with a characteristic impedance of 50Ω), there is a large drop in the square-law detection output of the magnetoresistive effect element (i.e., the signal level of the multiplication signal in the mixer). To avoid this phenomenon, the present applicant also investigated a construction where a high resistance is connected in series to the transfer line connected to the magnetoresistive effect element. However, with such construction, it becomes necessary to apply a high voltage to the magnetoresistive effect element so that the current required to cause the magnetoresistive effect element to resonate will flow in the magnetoresistive effect element. This results in the problem of increased power consumption by the mixer.

The present invention was conceived in view of the problem described above and it is a principal object of the present invention to provide a mixer that is capable of operating on low local power while avoiding a drop in the output of a multiplication signal, and also a frequency converting apparatus equipped with such mixer.

To achieve the stated object, a mixer according to the present invention comprises: a magnetoresistive effect element that includes a fixed magnetic layer, a free magnetic layer, and a nonmagnetic spacer layer disposed between the fixed magnetic layer and the free magnetic layer, is operable when a first high-frequency signal and a second high-frequency signal as a local signal are inputted, to multiply the first high-frequency signal and the second high-frequency signal according to a magnetoresistive effect to generate a multiplication signal; a magnetic field applying unit that applies a magnetic field to the free magnetic layer; and an impedance circuit that has a higher impedance for the multiplication signal than an impedance for the first high-frequency signal and the second high-frequency signal and is disposed between an input transfer line, which transfers the first high-frequency signal and the second high-frequency signal, and the magnetoresistive effect element.

According to the above mixer, it is possible to output the first high-frequency signal and the second high-frequency signal to a magnetoresistive effect element with low attenuation via an impedance circuit with low impedance, to multiply the first high-frequency signal using a second high-frequency signal of lower power as a local signal for the mixer, and to output the multiplication signal. As a result, it is possible to significantly reduce power consumption. Since the impedance circuit has a high impedance for a frequency band of the multiplication signal generated by the magnetoresistive effect element, it is possible to avoid a drop (attenuation) in the multiplication signal generated by the magnetoresistive effect element.

In the mixer according to the present invention, the impedance circuit may be constructed of a first filter whose pass band includes respective frequencies of the first high-frequency signal and the second high-frequency signal and whose attenuation band includes a frequency of the multiplication signal.

By using the above construction, it is possible to construct the first filter of passive elements. Accordingly, compared to when the impedance circuit is constructed of active elements, it is possible to achieve a significant reduction in power consumption.

In the mixer according to the present invention, the first filter may be constructed of a capacitance element whose self-resonant frequency band is set at the pass band.

By using the above construction, it is possible to simplify the construction of the mixer.

The mixer according to the present invention may further comprise a plurality of the first filters with respectively different pass bands, wherein the magnetic field applying unit may be constructed so as to be capable of changing a strength of the maghetic field.

By using the above construction, since it is possible to change the frequency of the second high-frequency signal and the resonant frequency of the magnetoresistive effect element in accordance with the frequency of the first high-frequency signal, it is possible to mix a first high-frequency signal and a second high-frequency signal of various frequencies and output the multiplication signal without changing the construction of the apparatus.

In the mixer according to the present invention, the first filter may include one of a stub and a resonator that is appended to a transfer line connected to the first filter and increases a selectivity of the first filter.

By using the above construction, since it is possible to increase the selectivity of the pass band of the first filter using stubs or a resonator, it is possible to reduce the outputting of unnecessary signals aside from the first high-frequency signal and the second high-frequency signal to the magnetoresistive effect element. Accordingly, it is possible to greatly reduce the effect of noise on mixing operations and frequency converting operations.

The mixer according to the present invention may further comprise an impedance converting circuit that inputs the multiplication signal and outputs the multiplication signal to an output transfer line at an output impedance that matches a characteristic impedance of the output transfer line and has an input impedance set higher than the output impedance.

By using the above construction, it is possible to input the multiplication signal generated by the magnetoresistive effect element with an input impedance set at a higher value than the characteristic impedance of the output transfer line. As a result, it is possible to avoid attenuation of the multiplication signal and output the multiplication signal with an output impedance that matches the characteristic impedance of the output transfer line. Accordingly, it is possible to efficiently generate the multiplication signal.

In the mixer according to the present invention, the magnetic field applying unit may keep the strength of the magnetic field constant.

By using the above construction, it is also possible to use a construction such as a permanent magnet to keep the strength of the magnetic field constant. Accordingly, it is possible to simplify the construction of the magnetic field applying unit and to reduce the manufacturing cost.

Further, to achieve the stated object, a frequency converting apparatus according to the present invention comprises: any of the mixers described above; and a second filter operable when a high frequency out of the frequencies of the first high-frequency signal and the second high-frequency signal is set at f1 and a low frequency is set at f2, to pass one of multiplication signals with a frequency (f1+f2) and (f1−f2) out of the multiplication signals.

According to the above frequency converting apparatus, when a high frequency out of the frequencies of the first high-frequency signal and the second high-frequency signal is set at f1 and a low frequency is set at f2, signals with the frequencies f1, f2 and multiplication signals of various frequencies (f1+f2), (f1−f2), 2×f1, 2×f2, 3×f1, 3×f2, . . . are outputted from the mixer, and out of such signals, it is possible to generate a multiplication signal with a frequency of (f1+f2) or a frequency of (f1−f2) as a multiplication signal of a desired frequency.

In the frequency converting apparatus according to the present invention, the second filter may be constructed of an amplifier whose upper limit frequency for an amplification operation is set between a frequency (f1−f2) of the multiplication signal and the frequency f2.

With the above construction, it is possible to construct the second filter from a single amplifier and thereby significantly simplify the construction of the frequency converting apparatus.

It should be noted that the disclosure of the present invention relates to a content of Japanese Patent Application 2009-128615 that was filed on 28 May 2009 and the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a mixer and a frequency converting apparatus will now be described with reference to the attached drawings.

First, the constructions of a mixer 1 and a frequency converting apparatus 100 that includes the mixer 1 will be described with reference to the drawings. Note that an example where the frequency converting apparatus 100 has been applied to a receiver apparatus RX will be described as an example.

Figure 1:
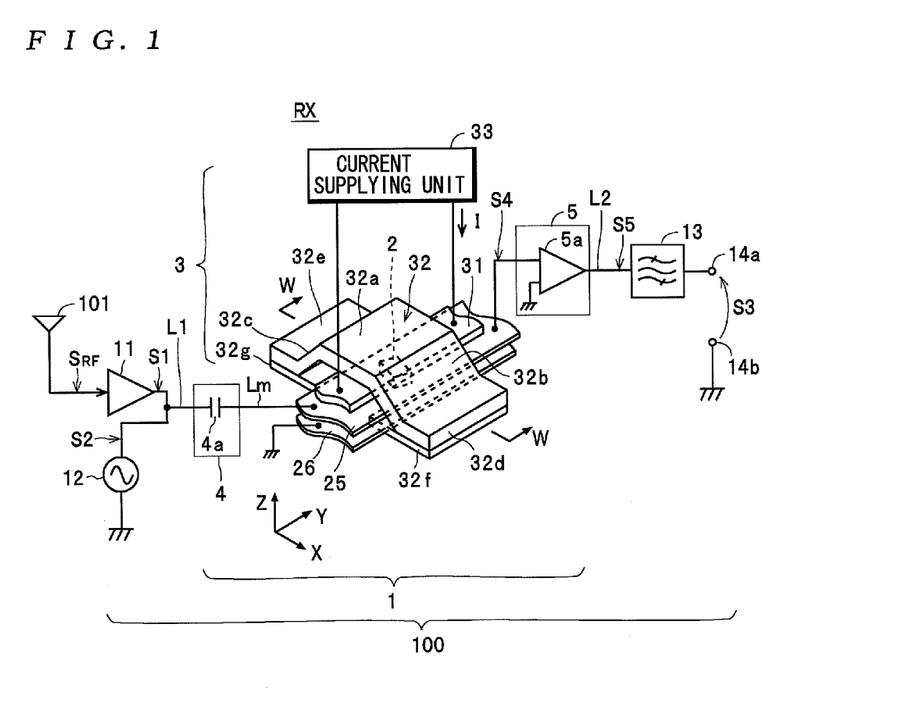
FIG. 1 is a diagram showing the construction of a frequency converting apparatus.

The frequency converting apparatus 100 shown in FIG. 1 and an antenna 101 together construct the receiver apparatus RX. The frequency converting apparatus 100 is disposed at a high-frequency stage of the receiver apparatus RX that receives an RF signal $S_{RF}$ outputted from the antenna 101 and functions so as to convert the frequency f1 of the RF signal $S_{RF}$ to the frequency fm of a multiplication signal S3. As one example, the frequency converting apparatus 100 includes the mixer 1 and an amplifier 11, a signal generating unit 12, a filter 13, and output terminals 14a, 14b (hereinafter collectively referred to as the output terminals 14 when no distinction is required). The amplifier 11 inputs and amplifies the RF signal $S_{RF}$ and outputs the result as a signal S1 (a first high-frequency signal). The signal generating unit 12 functions as a so-called local oscillator and generates a local signal (a second high-frequency signal) S2 with a frequency f2. As one example, the signal generating unit 12 generates and outputs a −15 dBm±5 dBm local signal S2. The signal S1 and the local signal S2 that are outputted in this way are transferred to an impedance circuit 4 via a signal transfer line (as one example, a microstrip line, hereinafter signal line) L1 whose characteristic impedance is set at 50Ω.

The mixer 1 includes a magnetoresistive effect element 2, a magnetic field applying unit 3, an impedance circuit 4, and an impedance converting circuit 5, and multiplies the signal S1 (with the frequency f1) outputted from the amplifier 11 and the local signal S2 (with the frequency f2) generated by the signal generating unit 12 and outputs an output signal S5 as a multiplication signal. The output signal S5 includes signals of the frequencies f1, f2 and various multiplication signals with the frequencies (f1+f2), (f1−f2), 2×f1, 2×f2, 3×f1, 3×f2, . . . . Note that the signal generating unit 12 is not an essential element for the frequency converting apparatus 100 and it is also possible to use a construction where the local signal S2 is inputted from outside the frequency converting apparatus 100 together with the RF signal $S_{RF}$. The mixer 1 shown in FIG. 1 can be represented by an equivalent circuit such as that shown in FIG. 2.

Figure 3:
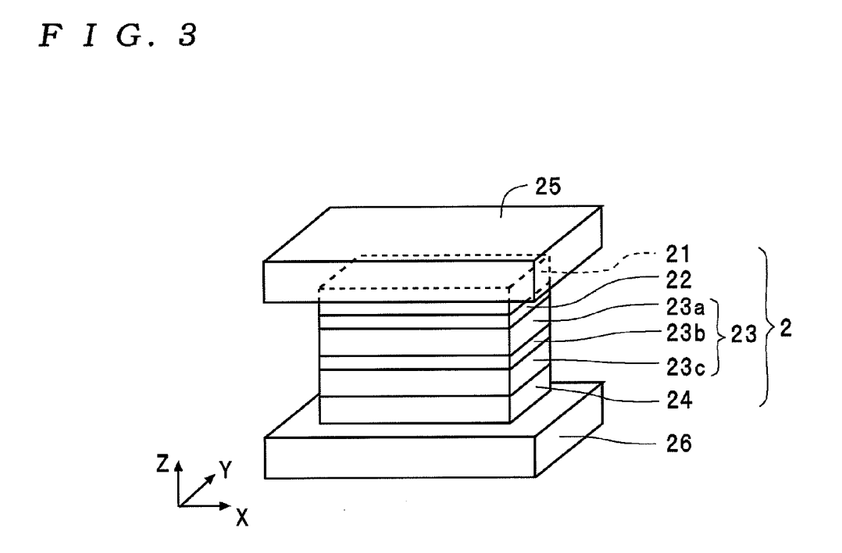
FIG. 3 is a perspective view of the vicinity of a magnetoresistive effect element (TMR element) shown in FIG. 1.
Figure 5:
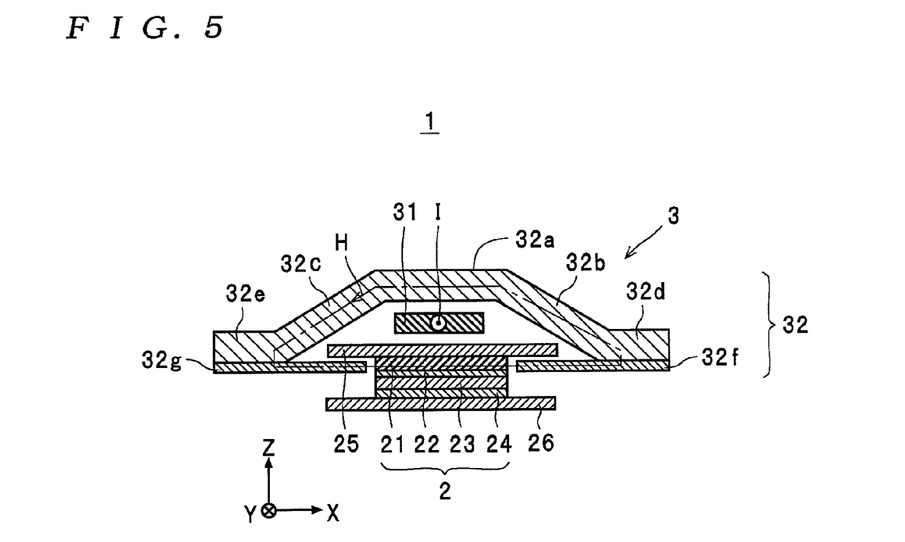
FIG. 5 is a cross-sectional view taken along a line W-W in FIG. 1.

As one example, the magnetoresistive effect element 2 is constructed of a TMR element that includes a free magnetic layer 21 as shown in FIGS. 3 and 5. More specifically, the magnetoresistive effect element 2 includes the free magnetic layer 21, a spacer layer 22, a fixed magnetic layer 23, and an antiferromagnetic layer 24 that are laminated in the mentioned order and are disposed between an upper electrode 25 and a lower electrode 26 in a state where the free magnetic layer 21 is connected to the upper electrode 25 and the antiferromagnetic layer 24 is connected to the lower electrode 26. Here, the free magnetic layer 21 is constructed of a ferromagnetic material as a magnetism-sensing layer. The spacer layer 22 corresponds to a nonmagnetic spacer layer, and is constructed of a nonmagnetic material that is an insulator so as to function as a tunneling barrier layer. Note that the spacer layer 22 is normally formed with a thickness of 1 nm or below. The lower electrode 26 is also connected to ground.

As one example, as shown in FIG. 3, the fixed magnetic layer 23 is constructed by forming a ferromagnetic layer (second magnetic layer) 23a whose magnetic orientation is fixed, a nonmagnetic layer 23b made of a metal such as ruthenium (Ru), and another ferromagnetic layer (first magnetic layer) 23c whose magnetic orientation is fixed in the opposite direction to the magnetic orientation of the ferromagnetic layer 23a, such layers being laminated in the mentioned order so that the ferromagnetic layer 23c is positioned above the antiferromagnetic layer 24. In this case, the respective magnetic orientations of the pair of ferromagnetic layers 23a, 23c are set so as to be perpendicular to the thickness (i.e., the Z axis direction) of the magnetoresistive effect element 2.

The antiferromagnetic layer 24 is exchange-coupled with the ferromagnetic layer 23c at the bottom of the fixed magnetic layer 23.

Figure 4:
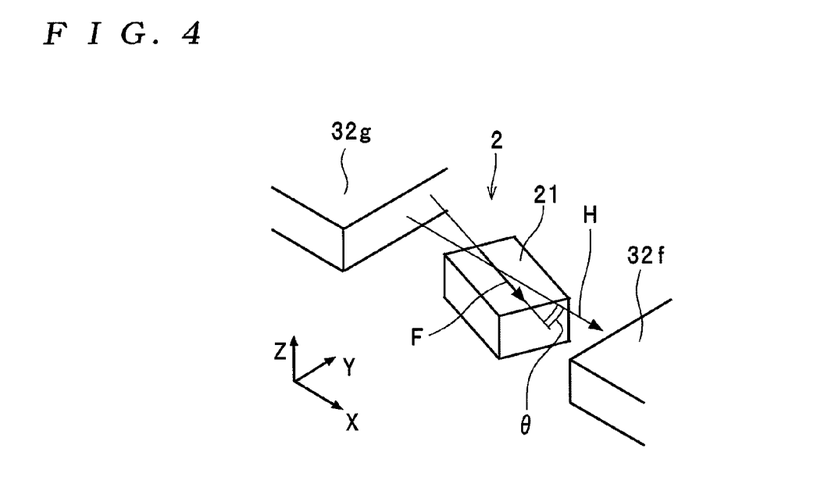
FIG. 4 is a perspective view of the vicinity of a free magnetic layer of the magnetoresistive effect element.

Also, as shown in FIG. 4, in order to facilitate resonance of the magnetic orientation of the free magnetic layer 21, the positional relationship between the magnetoresistive effect element 2 and the magnetic field applying unit 3 is set in advance so that the orientation of the axis of easy magnetization F of the free magnetic layer 21 and the orientation of the magnetic field H applied from the magnetic field applying unit 3 (described later) intersect at a predetermined angle θ (preferably an angle in a range of 5° to 175°, inclusive, and more preferably 90°) on an X-Y plane.

As shown in FIGS. 1 and 5, the magnetic field applying unit 3 includes a magnetic field generating wire 31, a magnetic yoke 32, and a current supplying unit 33. As shown in FIG. 5, the magnetic field generating wire 31 is disposed above the magnetoresistive effect element 2 with the upper electrode 25 in between. The magnetic yoke 32 includes a top magnetic body 32a, side magnetic bodies 32b, 32c, lower magnetic bodies 32d, 32e, and bottom magnetic bodies 32f, 32g. The top magnetic body 32a is disposed above the magnetic field generating wire 31. The side magnetic body 32b is disposed on one side of the magnetic field generating wire 31 (as one example, on the right side in FIG. 5) and is connected to the top magnetic body 32a. The side magnetic body 32c is disposed on the other side of the magnetic field generating wire 31 (as one example, on the left side in FIG. 5) and is also connected to the top magnetic body 32a. The lower magnetic body 32d is disposed on one side of the magnetoresistive effect element 2 (as one example, on the right side in FIG. 5) and is connected to the side magnetic body 32b. The lower magnetic body 32e is disposed on the other side of the magnetoresistive effect element 2 (as one example, on the left side in FIG. 5) and is connected to the side magnetic body 32c. By using the stated construction, the lower magnetic body 32e, the side magnetic body 32c, the top magnetic body 32a, the side magnetic body 32b, and the lower magnetic body 32d are connected in the mentioned order so as to form an overall band shape and are disposed above the magnetoresistive effect element 2 so as to span the magnetic field generating wire 31 as shown in FIG. 1.

As shown in FIGS. 1 and 5, the bottom magnetic body 32f is disposed below the lower magnetic body 32d in a state where the bottom magnetic body 32f is connected to the lower magnetic body 32d. An end portion on the magnetoresistive effect element 2 side of the bottom magnetic body 32f protrudes into a gap between the upper electrode 25 and the lower electrode 26 of the magnetoresistive effect element 2 as far as the periphery of one side surface of the free magnetic layer 21 of the magnetoresistive effect element 2 but is insulated from the upper electrode 25 and the lower electrode 26. The bottom magnetic body 32g is disposed below the lower magnetic body 32e in a state where the bottom magnetic body 32g is connected to the lower magnetic body 32e. An end portion on the magnetoresistive effect element 2 side of the bottom magnetic body 32e also protrudes into a gap between the upper electrode 25 and the lower electrode 26 as far as the periphery of the other side surface of the free magnetic layer 21 of the magnetoresistive effect element 2 but is insulated from the upper electrode 25 and the lower electrode 26.

With the construction described above, the magnetic yoke 32 forms a closed magnetic path for the magnetic field that is generated in the region of the magnetic field generating wire 31 when a current I flows in the magnetic field generating wire 31. As shown in FIG. 4, the magnetic yoke 32 applies a magnetic field H to the free magnetic layer 21 of the magnetoresistive effect element 2 disposed at the position of a gap in the closed magnetic path (i.e., the gap between the pair of bottom magnetic bodies 32f, 32g). Also, in the present embodiment, as one example, the magnetic field generating wire 31 and the magnetic yoke 32 of the magnetic field applying unit 3 described above are formed together with the magnetoresistive effect element 2 on a silicon wafer by a well-known semiconductor manufacturing process.

The current supplying unit 33 is connected to both ends of the magnetic field generating wire 31 that protrude from both sides of the top magnetic body 32a and supplies the current I to the magnetic field generating wire 31. The current supplying unit 33 is constructed so that the magnitude of the current I can be changed. Accordingly, by changing the magnitude of the current I outputted from the current supplying unit 33, the magnetic field applying unit 3 can change the strength of the magnetic field H applied to the magnetoresistive effect element 2 and thereby change the resonant frequency f0 of the magnetoresistive effect element 2. Note that although a single magnetic field generating wire 31 is formed so as to pass through inside the magnetic yoke 32 in the present embodiment, the strength of the magnetic field H can be increased by using a construction where the magnetic field generating wire 31 is formed in a coil so that a multiple number of magnetic field generating wires 31 pass inside the magnetic yoke 32.

The impedance circuit 4 has a higher impedance (that is, the impedance between input and output) for a voltage signal (multiplication signal) S4, described later, than the impedance (that is, impedance between input and output) for the signals S1, S2 and is disposed between the transfer line (input transfer line) L1 described above whose characteristic impedance is set at 50Ω and a transfer line Lm, which is connected to the magnetoresistive effect element 2 and has a characteristic impedance set at 50Ω, so as to bridge a gap of minute length formed between the transfer line L1 and the transfer line Lm. The impedance circuit 4 has a lower impedance for the signals S1, S2 transferred via the transfer line L1 than the characteristic impedance (50Ω) of the transfer line L1, and outputs the signals S1, S2 from the transfer line L1 to the transfer line Lm via such low impedance. That is, the impedance circuit 4 functions as an impedance element where the impedance between input and output for signals of a frequency band including the signals S1, S2 is low, and therefore passes the signals S1, S2 with the lowest possible attenuation to their respective amplitudes. The impedance circuit 4 is set so that the impedance (the impedance between input and output) when looking from the magnetoresistive effect element 2 side for a square-law detection output (i.e., the multiplication signal, the voltage signal S4 of a frequency (f1±f2)) generated by the magnetoresistive effect element 2 is higher than the characteristic impedances (50Ω) of the transfer lines L1, Lm (preferably an impedance of 500Ω or higher).

Figure 7:
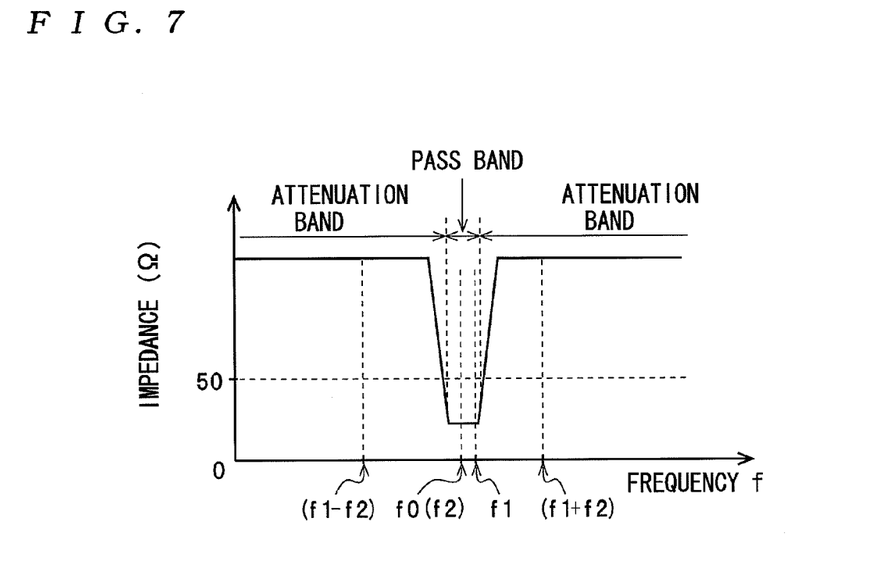
FIG. 7 is a conceptual graph showing impedance characteristics of an impedance circuit shown in FIG. 1.

In the mixer 1, as described later, the resonant frequency f0 of the magnetoresistive effect element 2 is matched to the frequency f2 of the local signal S2 and the frequency f1 of the signal S1 is normally set at a frequency close to the frequency f2. Accordingly, the impedance circuit 4 can be constructed as a bandpass filter with the impedance characteristics shown in FIG. 7, for example. Here, as shown in FIG. 7, the bandpass filter is set with impedance characteristics where the resonant frequency f0 of the magnetoresistive effect element 2 (i.e., the frequency f2 of the local signal S2) and the frequency f1 of the signal S1 are included in the pass band and where frequencies (f1+f2), (f1−f2), 2×f1, 2×f2, 3×f1, 3×f2, . . . of a multiplication signal as the square law detection output generated by the magnetoresistive effect element 2 are included in the attenuation band. The impedance circuit 4 is constructed of a coupling capacitor, for example, and also functions so as to prevent the leaking of a DC component of the square-law detection output generated by the magnetoresistive effect element 2 to the amplifier 11 and/or the signal generating unit 12.

Figure 2:
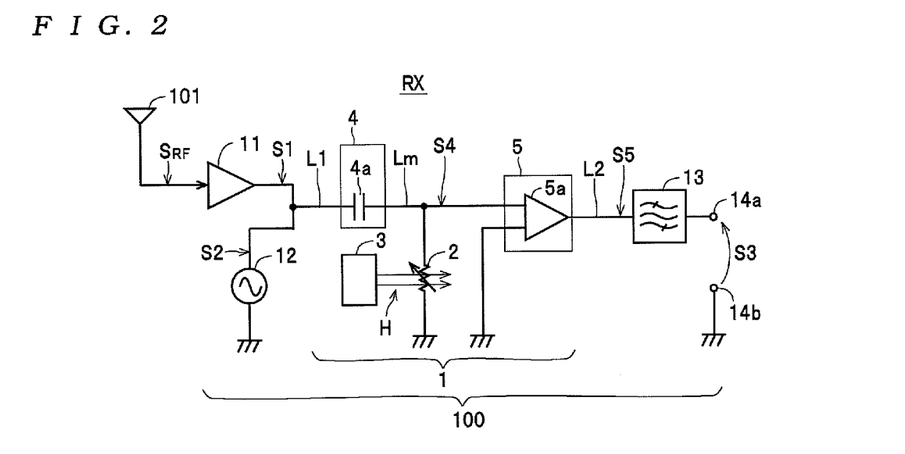
FIG. 2 is an equivalent circuit diagram of a mixer shown in FIG. 1.
Figure 8:
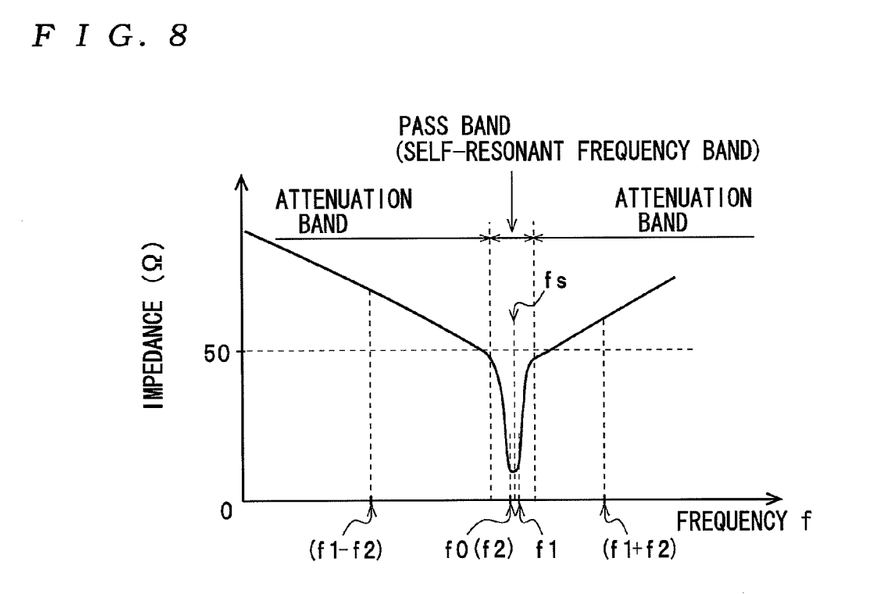
FIG. 8 is a conceptual graph showing impedance characteristics of a capacitor that constructs the impedance circuit.

Since a capacitor has an equivalent series inductance, as shown in FIG. 8, the impedance characteristics include a region where the frequency is lower than the self-resonant frequency fs (a capacitor region, that is, a region where the impedance falls as frequency increases) and the capacitor functions as a capacitor, a region where the frequency is higher than the self-resonant frequency fs (an inductance region, that is, a region where the impedance increases as frequency increases) and the capacitor functions as an inductor, and a narrow region centered on the self-resonant frequency fs where the impedance sharply falls toward the self-resonant frequency fs. This means that as shown in FIG. 8, a capacitor has impedance characteristics that enable the capacitor to function as a simple bandpass filter. Accordingly, as shown in FIG. 8, by using the frequency band with low impedance that includes the self-resonant frequency fs (i.e., the self-resonant frequency band) as the pass band shown in FIG. 7, it is possible to construct the impedance circuit 4 from a single capacitor (first filter). In the present embodiment, as shown in FIGS. 1 and 2, by constructing the impedance circuit 4 of a single capacitor 4a as the first filter (a capacitive element, as one example a 1005-size low-capacity chip capacitor), the construction of the apparatus is simplified. Note that since the capacitor 4a functions as a coupling capacitor, the capacitor 4a also functions so as to prevent a DC component of the square-law detection output generated by the magnetoresistive effect element 2 from leaking to the amplifier 11 and/or the signal generating unit 12.

The impedance converting circuit 5 is constructed using an operational amplifier 5a, for example. In the present embodiment, the operational amplifier 5a has one input terminal connected to the upper electrode 25 and the other input terminal connected to ground and functions as a differential amplifier. By doing so, the operational amplifier 5a receives an input of the voltage signal S4 that is generated across both ends of the magnetoresistive effect element 2 due to the signal S1 and the local signal S2 being inputted via the capacitor 4a, amplifies the voltage signal S4, and outputs the result as the output signal S5 to an output transfer line L2 (hereinafter also referred to as the "transfer line L2", as one example, a microstrip line). The operational amplifier 5a normally has characteristics where the input impedance is extremely high and the output impedance is sufficiently low. Accordingly, by using the stated construction, since the operational amplifier 5a inputs the voltage signal S4 generated across both ends of the magnetoresistive effect element 2 with a higher input impedance than the output impedance, amplifies the inputted voltage signal S4 to produce the output signal S5, and outputs the output signal S5 with a low impedance, the operational amplifier 5a functions as an impedance converting unit. In this case, the operational amplifier 5a outputs the output signal S5 with an output impedance that matches the characteristic impedance of the output transfer line L2. The filter 13 (second filter) is constructed of a bandpass filter (BPF), for example, and is disposed in the transfer line L2. By passing only a signal of a desired frequency out of the output signal S5, the filter 13 outputs the multiplication signal S3 to the output terminals 14. More specifically, as described later, the filter 13 passes a signal of one frequency (a desired frequency) out of the frequencies (f1−f2), (f1+f2) as the frequency fm.

Figure 6:
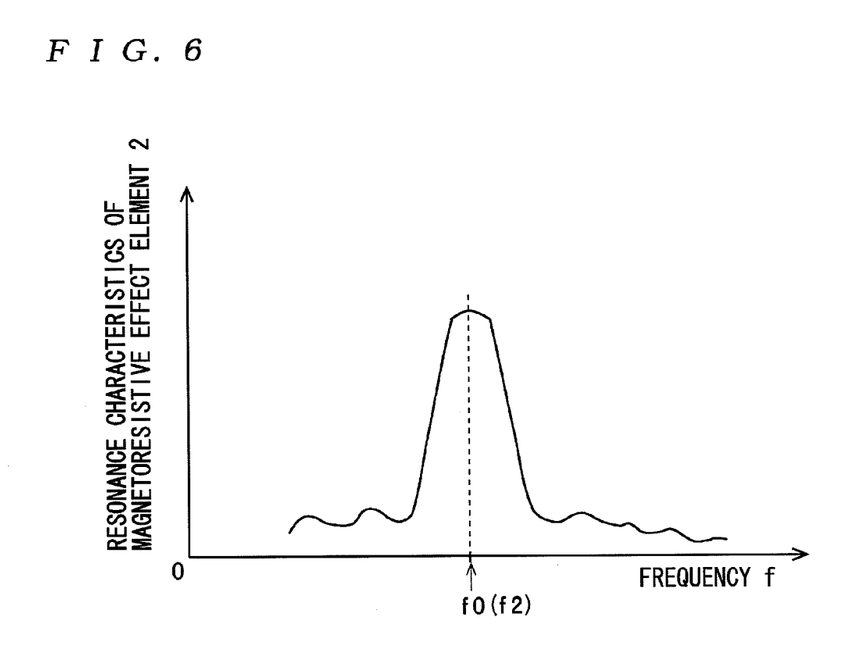
FIG. 6 is a graph showing the relationship between frequency and resonance of the magnetoresistive effect element when a magnetic field applied to the magnetoresistive effect element is constant.
Figure 9:
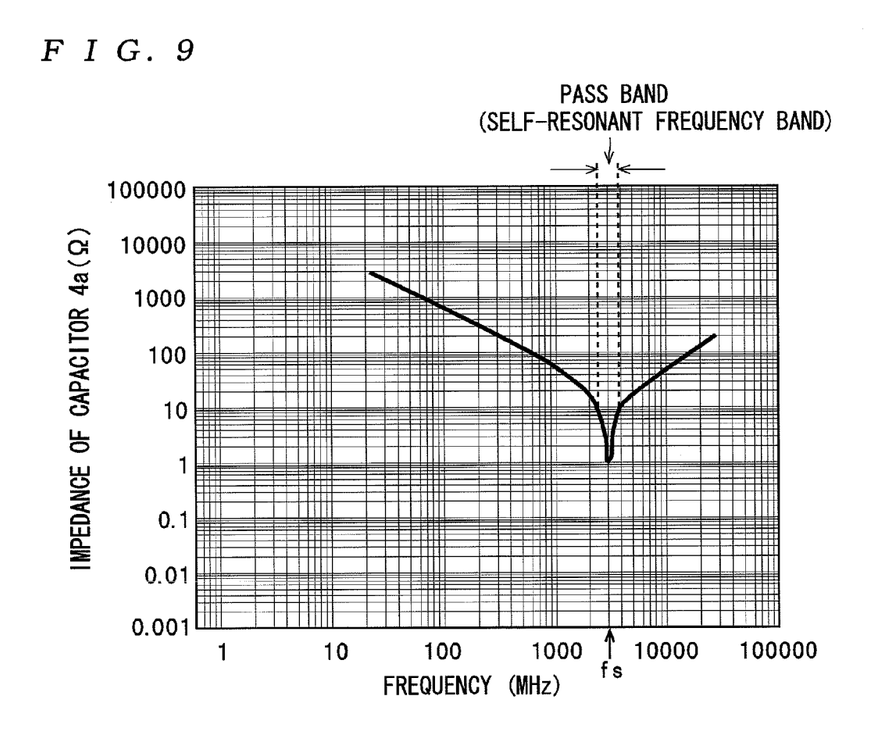
FIG. 9 is a graph showing the actual impedance characteristics of a capacitor.

Next, a mixing operation by the mixer 1 and a frequency converting operation by the frequency converting apparatus 100 will be described. As one example, it is assumed that the RF signal $S_{RF}$ (with a frequency f1=3.05 GHz) received via the antenna 101 is inputted and the signal generating unit 12 generates the local signal S2 (with a frequency f2=3.0 GHz (<f1)). A capacitor with the impedance characteristics shown in FIG. 9 is selected as the capacitor 4a that constructs the impedance circuit 4, with the frequencies f1, f2 of both signals S1, S2 included in a self-resonant frequency band (pass band) that includes the self-resonant frequency fs (=3.0 GHz). The resonance characteristics of the magnetoresistive effect element 2 should preferably have a peak at the frequency f2 of the local signal S2 as shown in FIG. 6. For this reason, the magnitude of the current I supplied from the current supplying unit 33 to the magnetic field generating wire 31 is set at a value (a constant value) that is likely to apply, to the magnetoresistive effect element 2, a magnetic field H that matches the resonant frequency f0 to the frequency f2 of the local signal S2. That is, the strength of the magnetic field H supplied to the magnetoresistive effect element 2 from the magnetic field applying unit 3 is kept constant at a strength that matches the resonant frequency f0 to the frequency f2 of the local signal S2. The local signal S2 is set at a power (for example, −15 dBm±5 dBm) that is capable of supplying a current that is likely to cause the magnetoresistive effect element 2 to resonate. Although the output signal S5 outputted from the impedance converting circuit 5 due to the mixing operation by the mixer 1 includes frequency components (f1, f2) of the signals S1, S2 and frequency components ((f1+f2), (f1−f2), 2×f1, 2×f2, 3×f1, 3×f2, ... ) of the respective multiplication signals, the filter 13 is constructed so as to pass a desired frequency component out of such frequency components (the frequency component (f1+f2) or the frequency component (f1−f2), as one example in the present embodiment, the low frequency component (f1−f2)) and to block passage of signals of other frequencies. Here, although the filter 13 is constructed as a bandpass filter, the filter 13 may be a lowpass filter.

In the frequency converting apparatus 100, in a state where the current I is being supplied from the current supplying unit 33 (a state where the magnetic field H is being applied to the magnetoresistive effect element 2), the local signal S2 (with the frequency f2) is inputted from the signal generating unit 12 into the mixer 1. Since the impedance of the impedance circuit 4 (the capacitor 4a) is a sufficiently low value (10Ω or below in FIG. 9) for the frequency f2 of the local signal S2, the local signal 22 passes the impedance circuit 4 with extremely low attenuation and is outputted to the magnetoresistive effect element 2. Here, the local signal S2 is set so that the frequency f2 thereof matches the resonant frequency f0 of the magnetoresistive effect element 2 and so that the power thereof is likely to cause the magnetoresistive effect element 2 to resonate. This means that strong resonance (spin torque ferromagnetic resonance) of the magnetoresistive effect element 2 is caused. In this resonance state, when the RF signal $S_{RF}$ (with the frequency f1) is inputted from the antenna 101 into the amplifier 11 and the amplifier 11 starts to output the signal S1, the magnetoresistive effect element 2 will carry out a square-law detection operation on the two signals S1, S2. When doing so, since the impedance of the impedance circuit 4 (the capacitor 4a) is a sufficiently low value (10Ω or below in FIG. 9) for the frequency f1 of the signal S1, in the same way as the local signal S2, the signal S1 passes the capacitor 4a without being reflected and with extremely low attenuation and is outputted to the magnetoresistive effect element 2.

When the magnetoresistive effect element 2 is resonating, a square-law detection operation (a rectifying action) can be achieved with a much smaller forward voltage compared to a semiconductor pn junction diode. This means that even when the power of the local signal S2 for causing the magnetoresistive effect element 2 to generate a forward voltage is lower than the power (for example, 10 dBm) required when a semiconductor pn junction diode is used, the magnetoresistive effect element 2 will still carry out a square-law detection operation to multiply the signal S1 and the local signal S2 and generate the voltage signal S4 across both ends thereof. At this time, even if a DC voltage is generated by the magnetoresistive effect element 2, the capacitor 4a will prevent such DC voltage from leaking to the antenna or the signal generating unit 12 (i.e., the capacitor 4a will cut the DC), to protect the magnetoresistive effect element 2 and also protect the antenna and the signal generating unit 12.

Although the voltage signal S4 generated by the square-law detection operation (mixing operation) by the magnetoresistive effect element 2 is constructed of various frequency components including the two frequency components (f1+f2, f1−f2) as described above, such frequency components are included in the attenuation band that is outside the pass band of the capacitor 4a. This means that the impedance of the capacitor 4a (that is, the impedance circuit 4) for the frequency components (f1+f2, f1−f2) is larger than the impedance of the capacitor 4a for the signal S1 (with the frequency f1) and the local signal S2 (with the frequency f2). In particular, as should be clear from FIG. 9, the impedance of the capacitor 4a for frequency components of the same frequency (f1−f2=50 MHz) as the multiplication signal S3 outputted by the frequency converting apparatus 100 in the present embodiment is a high value in excess of 1000Ω. Also, as described above, the input impedance of the operational amplifier 5a that constructs the impedance converting circuit 5 connected to the magnetoresistive effect element 2 is also extremely high (normally several hundred KΩ or above). Accordingly, since the impedance of the transfer line Lm on which the voltage signal S4 is outputted by the magnetoresistive effect element 2 is high (a value in excess of 1000Ω), as described above the magnetoresistive effect element 2 generates the voltage signal S4 with a high level and outputs the voltage signal S4 to the transfer line Lm.

Figure 10:
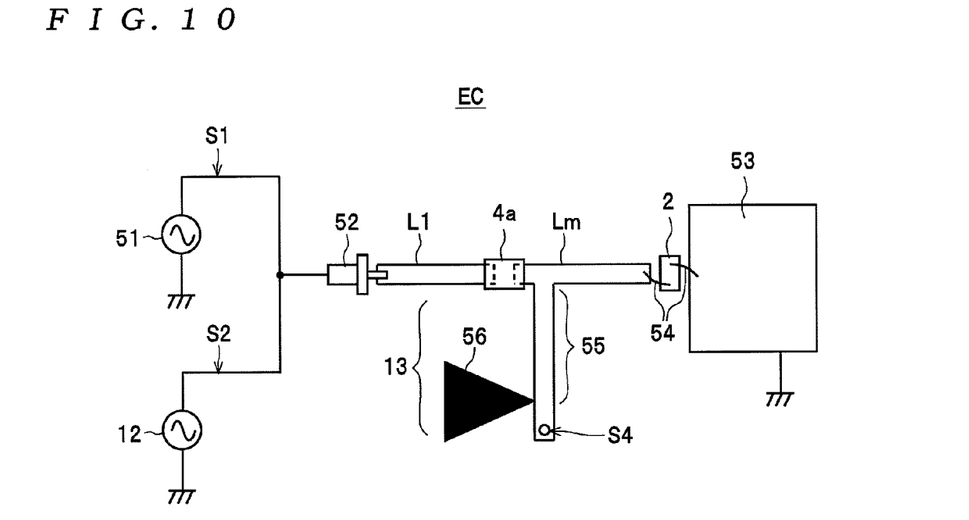
FIG. 10 is a block diagram showing the construction of an evaluation system including an evaluation tool for evaluating the mixer.

The voltage signal S4 generated by the mixer 1 was evaluated using an evaluation tool EC shown in FIG. 10, for example. This evaluation tool EC includes a network analyzer (Type 8720ES made by AGILENT) 51 that generates and outputs the signal S1, a signal generator (Type 83620B, also made by AGILENT) as the signal generating unit 12 that generates and outputs the local signal S2, a BNC connector 52 that is connected by a coaxial cable to the network analyzer 51 and the signal generating unit 12 and is also connected to the transfer line L1 and inputs the signals S1, S2 onto the transfer line L1, the transfer line L1 that is formed as a microstrip line and connects the BNC connector 52 and the capacitor 4a, the capacitor 4a (a 1005-size chip capacitor (4 pF) made by TDK), the transfer line Lm that is formed as a microstrip line and connects the capacitor 4a and the magnetoresistive effect element 2, the magnetoresistive effect element 2 that is connected between the transfer line Lm and a ground plane 53 by bonding wires 54, and the filter 13 which outputs the voltage signal S4 and is formed as a cut filter by a λ/4 stub line 55 connected to the transfer line Lm and a fan-shaped λ/4 stub 56 connected to the λ/4 stub line 55. Here, λ is the wavelength of the local signal S2 (with the frequency f2). Out of the various frequency components described above that are included in the signal generated by the magnetoresistive effect element 2, the frequency components f1, f2 are signals with a considerably high level compared to the other frequency components (f1+f2), (f1−f2), 2×f1, 2×f2, 3×f1, 3×f2, . . . , and therefore need to be attenuated. In this case, the frequency f1 of the signal S1 is close to the frequency f2 of the local signal S2. Accordingly, the length λ/4 of the resonator used to attenuate the local signal S2 is set at an effective length for attenuating both frequency components f1, f2.

Figure 11:
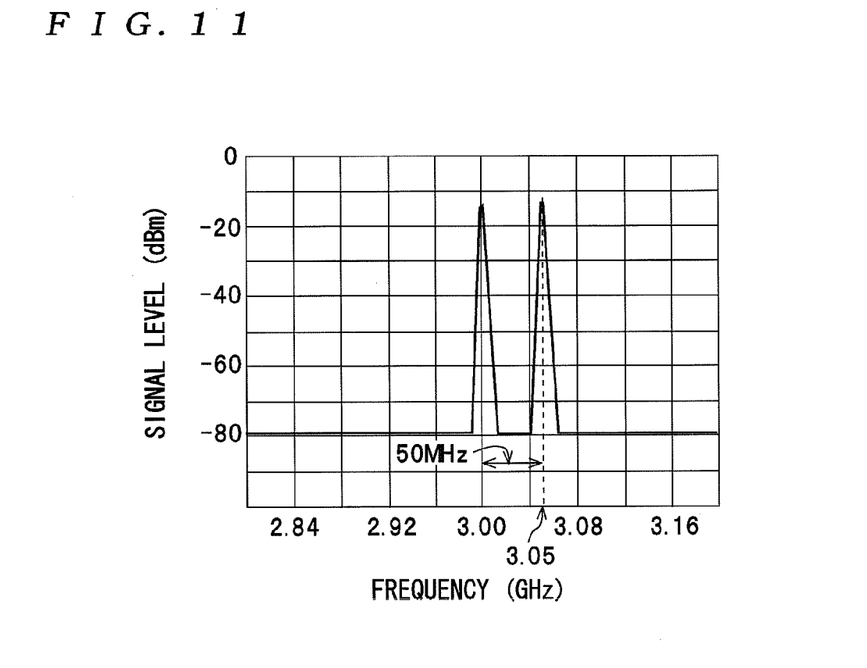
FIG. 11 is a spectrum graph of a signal and a local signal.
Figure 12:
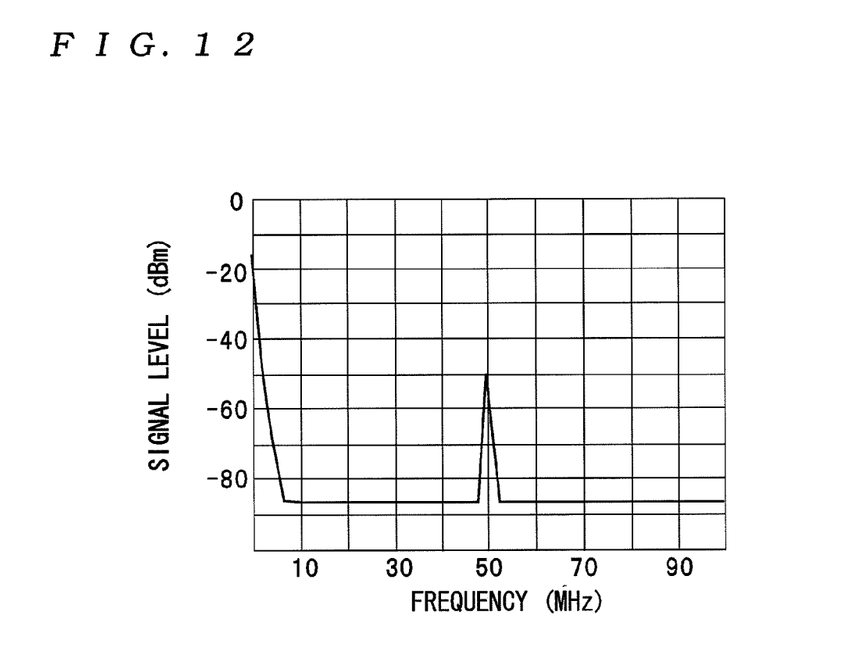
FIG. 12 is a spectrum graph of a voltage signal (multiplication signal)

As shown in FIG. 11, according to evaluation carried out using this evaluation tool EC, when the signal S1 (with a frequency f1=3.05 GHz) is inputted with a signal level of −15 dBm, the local signal S2 (with a frequency f2=3.0 GHz) is inputted with a signal level of −15 dBm, and the impedance of the transfer line Lm is maintained at a high value, as shown in FIG. 12, the magnetoresistive effect element 2 is capable of generating the voltage signal S4 with a signal level (the level for the frequency (f1−f2)=50 MHz) of −50 dBm. Since the detection output of a semiconductor pn junction diode is normally around −60 dBm, the level of the voltage signal S4 is at least 10 dBm higher. Note that since the filter 13 is constructed of a cut filter as described above, the voltage signal S4 evaluated by the evaluation tool EC is composed of the low frequency component (f1−f2) out of the two frequency components (f1+f2, f1−f2) generated by the square-law detection operation (mixing operation) by the magnetoresistive effect element 2.

Next, the operational amplifier 5a that constructs the impedance converting circuit 5 amplifies the voltage signal S4 and outputs the result to the output transfer line L2 as the output signal S5. Next, the filter 13 passes one of the frequency components (the intermediate frequency: f1−f2) out of the two frequency components (f1+f2, f1−f2) included in the output signal S5 and outputs such frequency component to the output terminals 14 as the multiplication signal S3. By doing so, only the desired multiplication signal S3 (with the frequency (f1−f2)) is outputted out of the voltage signal (multiplication signal) S4 from the mixer 1 that was produced by multiplying the signal S1 (with the frequency f1) and the local signal S2 (with the frequency f2).

In this way, according to the mixer 1 and the frequency converting apparatus 100, by having the impedance circuit 4 disposed between the transfer line L1 and the magnetoresistive effect element 2 output the signal S1 (with the frequency f1) and the local signal S2 (with the frequency f2) inputted via the transfer line L1 to the magnetoresistive effect element 2 via its own impedance that is lower than the characteristic impedance of the transfer line L1, the signals are outputted to the magnetoresistive effect element 2 with little attenuation and the output impedance in the frequency band of the voltage signal (multiplication signal) S4 generated by the magnetoresistive effect element 2 is set higher than the impedance for the signals S1, S2. Accordingly, with the mixer 1 and the frequency converting apparatus 100, it is possible to output the signal S1 and the local signal S2 to the magnetoresistive effect element 2 with little attenuation. Therefore, since it is possible to output the multiplication signal S3 (the frequency component (f1−f2)) by mixing (i.e., multiplication) of the signal S1 and the local signal S2 using a local signal S2 of lower power, putting this another way, by multiplying the signal S1 by a local signal S2 of lower power, a significant reduction in power consumption is possible. Also, since the impedance circuit 4 has a high impedance in the frequency band of the voltage signal (multiplication signal) S4 generated by the magnetoresistive effect element 2, it is possible to avoid a drop (attenuation) in the voltage signal (multiplication signal) S4 generated by the magnetoresistive effect element 2. As a result, it is also possible to avoid a drop in the output of the multiplication signal S3.

Also, according to the mixer 1 and the frequency converting apparatus 100, by constructing the impedance circuit 4 using a first filter (a bandpass filter, in the present embodiment, the capacitor 4a) where, out of the frequency components included in the voltage signal S4, the frequencies f1, f2 of the signal S1 and the local signal S2 are included in the pass band and the frequencies of the multiplication signal (f1−f2, f1+f2, 2×f1, 2×f2, 3×f1, 3×f2, . . . ) are included in the attenuation band, it is possible to construct the first filter of a passive element, such as a capacitor, a stub as described later, or resonator. This means that it is possible to significantly reduce power consumption compared to when the impedance circuit 4 is constructed of an active element. In addition, by constructing the first filter from a single capacitor 4a whose self-resonant frequency band is set at the pass band described above, it is possible to simplify the construction of the mixer 1 and the frequency converting apparatus 100. Note that it is also possible to use a construction where the first filter is constructed of a stub or a resonator together with the capacitor 4a to thereby increase the selectivity of the pass band of the filter as described later.

Also, according to the mixer 1 and the frequency converting apparatus 100, by providing the impedance converting circuit 5 that inputs the voltage signal (multiplication signal) S4 with a higher input impedance than the characteristic impedance of the transfer line Lm and outputs the voltage signal S4 with an output impedance that matches the transfer line L2, it is possible, even in a construction where the characteristic impedance of the transfer line L2 is low, to avoid a drop (attenuation) in the voltage signal (multiplication signal) S4 generated by the magnetoresistive effect element 2, and as a result, it is possible to avoid a drop in the output of the multiplication signal S3.

Note that the present invention is not limited to the construction described above and may be adapted to a variety of constructions. As one example, although not shown, it is also possible to construct the impedance converting circuit 5 and the filter 13 from a single amplifier (for example, an operational amplifier). When such construction is used, the upper limit frequency for an amplification operation by the amplifier is set between the frequency (f1−f2) of the multiplication signal S3 and the frequency f2 of the local signal S2. By using the stated construction, it is possible for the amplifier to input the voltage signal S4 generated by the magnetoresistive effect element 2 mixing (multiplying) the signal S1 and the local signal S2 with a high impedance and to output the multiplication signal S3 by attenuating the high frequency components (f2, f1, f1+f2, 2×f1, 2×f2, 3×f1, 3×f2, . . . ) out of the frequency components (f1−f2, f2, f1, f1+f2, 2×f1, 2×f2, 3×f1, 3×f2, . . . ) included in the voltage signal S4 and amplifying (or buffering) and passing only the low frequency component (f1−f2). As a result, it is possible to significantly simplify the constructions of the mixer 1 and the frequency converting apparatus 100.

It is also possible to construct an impedance circuit from a plurality of first filters with respectively different pass bands. A mixer 1A and a frequency converting apparatus 100A that use such construction will now be described with reference to FIGS. 13 and 14. Note that components that are the same as in the mixer 1 and the frequency converting apparatus 100 described above have been assigned the same reference numerals and duplicated description thereof is omitted.

First, the constructions of the mixer 1A and the frequency converting apparatus 100A that includes the mixer 1A will be described with reference to the drawings. Note that in this example, an application where the frequency converting apparatus 100A is used in a receiver apparatus RX1 is described.

Figure 13:
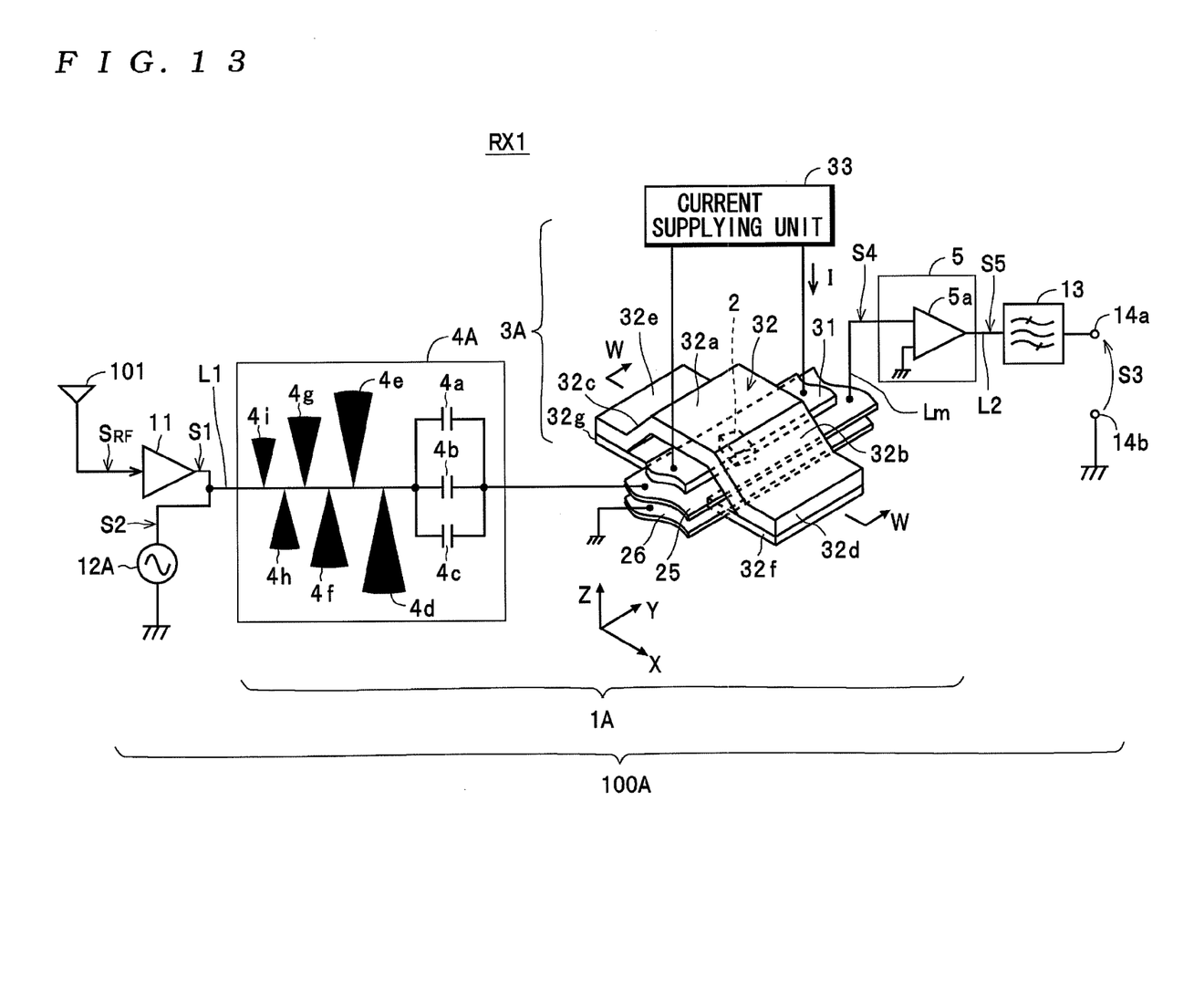
FIG. 13 is a diagram showing the construction of another mixer and another frequency converting apparatus.

The frequency converting apparatus 100A shown in FIG. 13 and the antenna 101 together construct the receiver apparatus RX1. The frequency converting apparatus 100A is disposed at a high-frequency stage of the receiver apparatus RX1 that receives an RF signal $S_{RF}$ outputted from the antenna 101 and functions so as to convert the frequency f1 of the RF signal $S_{RF}$, which is selected out of frequencies f1a, f1b, f1c, to the frequency fm of the multiplication signal S3. As one example, the frequency converting apparatus 100A includes the mixer 1A and the amplifier 11, a signal generating unit 12A, the filter 13, and the output terminals 14a, 14b. The signal generating unit 12A functions as a so-called local oscillator and generates a local signal (a second high-frequency signal) S2 with an arbitrary frequency f2 selected out of frequencies f2a, f2b, f2c. The signal S1 and the local signal S2 outputted in this way are transferred via the transfer line L1 to an impedance circuit 4A.

The mixer 1A includes the magnetoresistive effect element 2, a magnetic field applying unit 3A, the impedance circuit 4A, and the impedance converting circuit 5, multiplies the signal S1 (with the frequency f1) outputted from the amplifier 11 and the local signal S2 (with the frequency f2) generated by the signal generating unit 12A, and outputs an output signal S5 (a signal with the frequency f1±f2, more specifically, a signal with a frequency that is one of f1a±f2a, f1b±f2b, and f1c±f2c) as a desired multiplication signal. Note that the signal generating unit 12A is not an essential element for the frequency converting apparatus 100A and it is also possible to use a construction where the local signal S2 is inputted from outside the frequency converting apparatus 100A together with the RF signal $S_{RF}$.

As shown in FIG. 13, the magnetic field applying unit 3A includes the magnetic field generating wire 31, the magnetic yoke 32, and the current supplying unit 33, and is constructed so that the magnitude of the current I supplied to the magnetic field generating wire 31 can be changed between several levels (in the present embodiment, the three levels (Ia, Ib, Ic) as one example). With this construction, by changing the magnitude of the current I, it is possible for the magnetic field applying unit 3A to change the strength of the magnetic field H applied to the magnetoresistive effect element 2 between several levels (in the present embodiment, three levels as one example) and thereby change the resonant frequency f0 of the magnetoresistive effect element 2 between several levels (in the present embodiment, three levels composed of the resonant frequencies f0a, f0b, f0c). Here, the resonant frequencies f0a, f0b, f0c are set at the respective frequencies f2a, f2b, f2c of the local signal S2.

The impedance circuit 4A outputs the signal S1 and the local signal S2 transferred via the transfer line L1 to the magnetoresistive effect element 2 via a lower impedance than the characteristic impedance (50Ω) of the transfer line L1. As one example, the impedance circuit 4A is constructed of a plurality of first filters (in the present embodiment, three bandpass filters) and functions as an impedance element with a low impedance between input and output for the signals S1, S2 with frequencies included in three pass bands Wa, Wb, Wc (pass bands with respectively different frequency bands) so as to pass the signals S1, S2 with the lowest possible attenuation to the amplitudes of such signals. The impedance circuit 4A is set so that the impedance (the impedance between input and output) when looking from the magnetoresistive effect element 2 side for a square-law detection output (i.e., the voltage signal S4 with a frequency (f1±f2)) that has been generated by the magnetoresistive effect element 2 and is included in the attenuation band (a frequency band aside from the pass bands Wa, Wb, Wc) is a higher impedance (preferably an impedance of 500Ω or higher) than the characteristic impedance (50Ω) of the transfer line L1.

Figure 14:
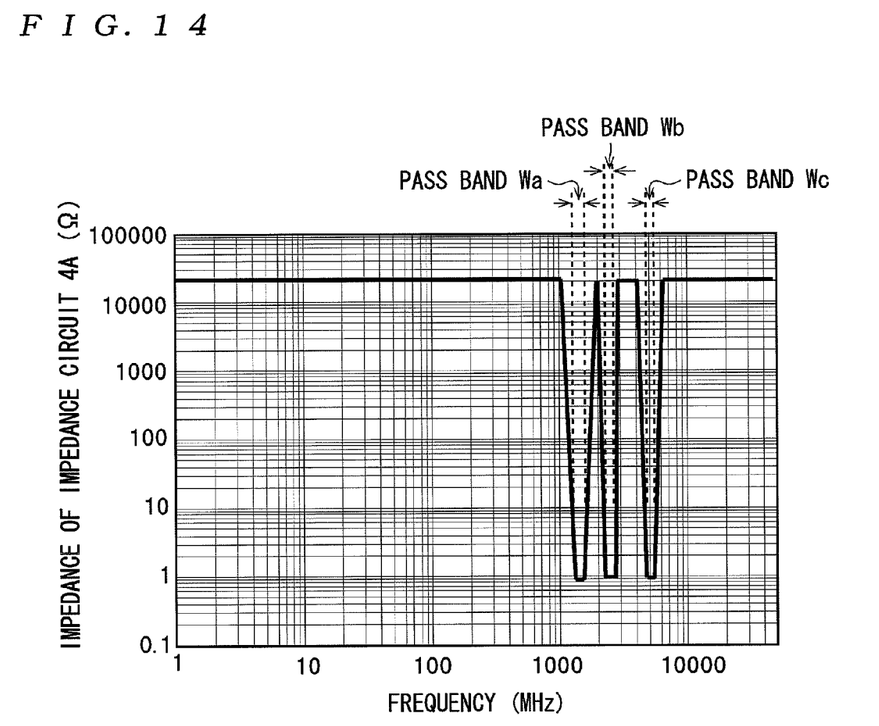
FIG. 14 is a conceptual graph showing the impedance characteristics of an impedance circuit appearing in FIG. 13.

More specifically, as shown in FIG. 13, the impedance circuit 4A includes a filter (bandpass filter) that is constructed of, for example, three first filters, i.e., the capacitor 4a and two stubs 4d, 4e and whose pass band Wa is set at around 1.6 GHz (a frequency band that includes 1.60 GHz and 1.65 GHz) as shown in FIG. 14, another filter (bandpass filter) that is constructed of the capacitor 4b and two stubs 4f, 4g and whose pass band Wb is set at around 2.4 GHz (a frequency band that includes 2.40 GHz and 2.45 GHz) as shown in FIG. 14, and another filter (bandpass filter) that is constructed of the capacitor 4c and two stubs 4h, 4i and whose pass band Wc is set at around 5.0 GHz (a frequency band that includes 5.00 GHz and 5.05 GHz) as shown in FIG. 14. That is, the impedance circuit 4A is constructed of a plurality of first filters with respectively different pass bands. The stubs 4d to 4i are fan-shaped λ/4 stubs as one example in the present embodiment. By adding stubs whose lengths are equivalent to ¼ of the wavelength λ for frequencies where the selectivity (so-called shoulder characteristics) of the filter pass band for a target frequency is gently sloping, it is possible to absorb signals of frequency components at the shoulders of the filter pass band in the resonator and prevent transmission. By doing so, the selectivity of the pass band of the corresponding filter is increased (i.e., the sharpness of the pass band is improved).

The filter 13 is constructed of a bandpass filter, for example, and is disposed in the transfer line L2. The filter 13 outputs the multiplication signal S3 to the output terminals 14 by passing a signal of a desired frequency out of the output signal S5. More specifically, in the present embodiment, the filter 13 outputs the multiplication signal S3 by passing signals of various frequencies (f1−f2, that is, f1a−f2a, f1b−f2b, f1c−f2c) as the frequency fm.

Next, a mixing operation by the mixer 1A and a frequency converting operation by the frequency converting apparatus 100A will be described. The mixing operation and the frequency converting operation in the present example differ to the mixing operation by the mixer 1 and the frequency converting operation by the frequency converting apparatus 100 described earlier in that the frequency of the local signal S2 outputted from the signal generating unit 12A and the magnitude of the current I supplied from the current supplying unit 33 to the magnetic field generating wire 31 are selected in accordance with the frequency f1 of the RF signal $S_{RF}$ received via the antenna 101, but the operations are otherwise the same as those described earlier. The following description will therefore focus on the differences and detailed description of operations that are the same is omitted. As one example, it is assumed that one of a signal with a frequency of f1a (=1.65 GHz), a signal with a frequency of f1b (=2.45 GHz), and a signal with a frequency of f1c (=5.05 GHz) is inputted as the RF signal $S_{RF}$. It is also assumed that the signal generating unit 12A is constructed so as to be capable of selectively outputting one of a signal with a frequency f2a (=1.6 GHz), a signal with a frequency f2b (=2.4 GHz), and a signal with a frequency f2c (=5.0 GHz) as the local signal S2.

First, the operation for the case where a signal with the frequency f1a (=1.65 GHz) is inputted as the RF signal $S_{RF}$ and the multiplication signal S3 with the frequency fm is outputted will be described. In this case, the signal generating unit 12A is set so as to output a signal with the frequency f2a (=1.6 GHz) as the local signal S2. The magnetic field applying unit 3A is set so as to supply the current I with the magnitude Ia to the magnetic field generating wire 31. By doing so, the resonant frequency f0 of the magnetoresistive effect element 2 is set at the resonant frequency f0a (=f2a).

With these settings, in the frequency converting apparatus 100A, the signal generating unit 12A outputs the local signal S2 (with the frequency f2a). In this case, since a frequency band that includes the frequency f2a is set as the pass band Wa in the impedance circuit 4A (that is, since the impedance of the impedance circuit 4A is a sufficiently low value (10Ω or below in FIG. 14)), the local signal S2 passes the impedance circuit 4A with extremely low attenuation and is outputted to the magnetoresistive effect element 2. In this state, the local signal S2 is set so that the frequency f2a thereof matches the resonant frequency f0a of the magnetoresistive effect element 2 and the power thereof is likely to cause the magnetoresistive effect element 2 to resonate. This means that strong resonance (spin torque ferromagnetic resonance) of the magnetoresistive effect element 2 is caused. In this resonance state, when the RF signal $S_{RF}$ (with the frequency f1a) is inputted from the antenna 101 to the amplifier 11, the magnetoresistive effect element 2 will carry out a square-law detection operation on the two signals S1, S2. At this point, since the impedance of the impedance circuit 4A is a sufficiently low value (10Ω or below in FIG. 14) for the frequency f1a of the signal S1, in the same way as the local signal S2, the signal S1 passes the impedance circuit 4A with extremely low attenuation and is outputted to the magnetoresistive effect element 2.

In this case, in the same way as in the mixer 1, the magnetoresistive effect element 2 carries out a square-law detection operation to multiply the signal S1 and the local signal S2 and generate the voltage signal S4 across both ends thereof. In the present embodiment, the magnetoresistive effect element 2 multiplies the signal S1 (with the frequency f1a=1.65 GHz) and the local signal S2 (with the frequency f2a=1.60 GHz) to generate the voltage signal S4 that includes the desired two frequency components (f1a+f2a, f1a−f2a). In this case, at least one of the frequency components (f1a−f2a=50 MHz) out of such frequency components is included in an attenuation band that is outside the pass band of the impedance circuit 4A. For this reason, the impedance of the impedance circuit 4A for such frequency components (f1a−f2a) is a higher value (a high value in excess of 1000Ω in FIG. 14) than the impedance of the impedance circuit 4A for the signal S1 (with the frequency f1a) and the local signal S2 (with the frequency f2a) inputted into the impedance circuit 4A. Also, as described above, the input impedance of the operational amplifier 5a that constructs the impedance converting circuit 5 connected to the magnetoresistive effect element 2 is also set at an extremely high value (normally several hundred KΩ or above). Accordingly, since the impedance of the transfer line Lm on which the voltage signal S4 is outputted by the magnetoresistive effect element 2 is a high value (a value in excess of 1000Ω), the magnetoresistive effect element 2 generates the voltage signal S4 including the frequency component (f1a−f2a) with a high level and outputs the voltage signal S4 to the transfer line Lm.

Next, the operational amplifier 5a that constructs the impedance converting circuit 5 amplifies the voltage signal S4 and outputs the result to the transfer line L2 as the output signal S5. Finally, the filter 13 passes one frequency component (the intermediate frequency f1a−f2a) out of the two desired frequency components (f1a+f2a, f1a−f2a) included in the output signal S5 and outputs such frequency component to the output terminals 14 as the multiplication signal S3.

During a mixing operation by the mixer 1A and a frequency converting operation by the frequency converting apparatus 100A for a case where a signal with the frequency f1b (=2.45 GHz) is inputted as the RF signal $S_{RF}$ and the multiplication signal S3 with the frequency fm is outputted, the signal generating unit 12A is set so as to output a signal with the frequency f2b (=2.4 GHz) as the local signal S2, the magnetic field applying unit 3A is set so as to supply the current I with the magnitude Ib to the magnetic field generating wire 31, and the resonant frequency f0 of the magnetoresistive effect element 2 is set at the resonant frequency f0b (=f2b). By doing so, in the same way as when the signal with the frequency f1a (=1.65 GHz) is inputted as the RF signal $S_{RF}$ described above, the frequency converting apparatus 100A outputs the multiplication signal S3 composed of a frequency component (with an intermediate frequency, f1b−f2b=50 MHz) from the output terminals 14. Also, during a mixing operation by the mixer 1A and a frequency converting operation by the frequency converting apparatus 100A for a case where a signal with the frequency f1c (=5.05 GHz) is inputted as the RF signal $S_{RF}$ and the multiplication signal S3 with the frequency fm is outputted, the signal generating unit 12A is set so as to output a signal with the frequency f2c (=5.0 GHz) as the local signal S2, the magnetic field applying unit 3A is set so as to supply the current I with the magnitude Ic to the magnetic field generating wire 31, and the resonant frequency f0 of the magnetoresistive effect element 2 is set at the resonant frequency f0c (=f2c). By doing so, in the same way as when the signal with the frequency f1a (=1.65 GHz) is inputted as the RF signal $S_{RF}$ described above, the frequency converting apparatus 100A outputs the multiplication signal S3 composed of a frequency component (with an intermediate frequency, f1c−f2c=50 MHz) from the output terminals 14.

Therefore, according to the mixer 1A and the frequency converting apparatus 100A, in the same way as with the mixer 1 and the frequency converting apparatus 100, it is possible to output the signal S1 and the local signal S2 to the magnetoresistive effect element 2 with little attenuation. This means that it is possible to mix (multiply) the signal S1 and the local signal S2 using a local signal S2 of lower power and output the multiplication signal S3 (the frequency component (f1−f2)). By doing so, it is possible to significantly reduce power consumption. Also, since the impedance circuit 4A has a high impedance in a frequency band of a voltage signal (multiplication signal) S4 generated by the magnetoresistive effect element 2, it is possible to avoid a drop (attenuation) in the voltage signal (multiplication signal) S4 generated by the magnetoresistive effect element 2, and as a result, it is possible to achieve the same effects as the mixer 1 and the frequency converting apparatus 100, such as avoiding a drop in the output of the multiplication signal S3.

In addition, according to the mixer 1A and the frequency converting apparatus 100A, by constructing the impedance circuit 4A so as to include a plurality of first filters with respectively different pass bands and changing the frequency f2 of the local signal S2 outputted from the signal generating unit 12A and the resonant frequency f0 of the magnetoresistive effect element 2 in accordance with the frequency f1 of the inputted signal S1, it is possible to mix a signal S1 and a local signal S2 of various frequencies and output the multiplication signal S3 without changing the construction of the apparatus.

Also, by using stubs in addition to capacitors in the respective first filters that construct the impedance circuit 4A to increase the selectivity of the pass bands of the respective first filters, it is possible to greatly reduce the output of signals of frequencies aside from the signal S1 and the local signal S2 to the magnetoresistive effect element 2. As a result, it is possible to greatly reduce the effects of noise on mixing operations and frequency converting operations.

Note that the present invention is not limited to the construction described above and may be adapted to a variety of constructions. For example, although an example where a TMR element such as an MgO-TMR element is used as the magnetoresistive effect element 2 has been described above, it is also possible to use another magnetoresistive effect element such as a CPP-GMR (Current-Perpendicular-to-Plane Giant MagnetoResistance) element. Also, although an example has been described where the low frequency component (f1−f2) is passed by a lowpass filter or a bandpass filter out of the two desired frequency components (f1+f2, f1−f2) included in the output signal S5 outputted from the impedance converting circuit 5 due to a mixing operation by the mixers 1, 1A, in a case where the high frequency component (f1+f2) is passed and outputted as the multiplication signal S3, it is possible to construct the filter 13 of a bandpass filter or a highpass filter.

Also, although a construction where the impedance circuits 4, 4A are constructed of the first filter using a passive filter composed of only passive elements such as capacitors has been described, it is also possible to construct the impedance circuits 4, 4A of the first filter using an active filter constructed of an operational amplifier. Further, also in the impedance circuits 4, 4A constructed of the first filter using such an active filter, it is possible to increase the selectivity of the filter by using the stubs Although a construction where the strength of the magnetic field H applied from the magnetic field applying unit 3 to the magnetoresistive effect element 2 can be changed is used in the example described above, since the strength of the magnetic field H produced by the magnetic field applying unit 3 may also be fixed when the frequency f2 of the local signal S2 is fixed, it is also possible to use a construction where the magnetic field applying unit 3 is constructed of a permanent magnet or the like and the strength of the magnetic field is kept constant. By using this construction, since it is possible to simplify the construction of the magnetic field applying unit 3, it is possible to reduce the manufacturing cost.

Although a construction where the frequency f2 of the local signal S2 matches the resonant frequency f0 of the magnetoresistive effect element 2 is used, it should be obvious that the frequency f2 may be a frequency that is merely close to the resonant frequency f0. Also, although the selectivity of the filter is increased in the present embodiment by using the stubs 4e to 4i, it is possible to increase the selectivity of the filter using a resonator (not shown) in place of the stubs 4e to 4i. Further, although the construction where each first filter in the impedance circuit 4A is constructed using not only the capacitor but also the stubs 4e to 4i or a resonator is used to thereby increase the selectivity of the pass band of the first filter, if there is no need to increase the selectivity, the first filter may be constructed only of the capacitor.

What is claimed is:

1. A mixer comprising:
a magnetoresistive effect element that includes a fixed magnetic layer, a free magnetic layer, and a nonmagnetic spacer layer disposed between the fixed magnetic layer and the free magnetic layer, is operable when a first high-frequency signal and a second high-frequency signal as a local signal are inputted, to multiply the first high-frequency signal and the second high-frequency signal according to a magnetoresistive effect to generate a multiplication signal;
a magnetic field applying unit that applies a magnetic field to the free magnetic layer; and
an impedance circuit that has a higher impedance for the multiplication signal than an impedance for the first high-frequency signal and the second high-frequency signal and is disposed between an input transfer line, which transfers the first high-frequency signal and the second high-frequency signal, and the magnetoresistive effect element.

2. The mixer according to claim 1,
wherein the impedance circuit is constructed of a first filter whose pass band includes respective frequencies of the first high-frequency signal and the second high-frequency signal and whose attenuation band includes a frequency of the multiplication signal.

3. The mixer according to claim 2,
wherein the first filter is constructed of a capacitance element whose self-resonant frequency band is set at the pass band.

4. The mixer according to claim 2,
further comprising a plurality of the first filters with respectively different pass bands,
wherein the magnetic field applying unit is constructed so as to be capable of changing a strength of the magnetic field.

5. The mixer according to claim 3,
further comprising a plurality of the first filters with respectively different pass bands,
wherein the magnetic field applying unit is constructed so as to be capable of changing a strength of the magnetic field.

6. The mixer according to claim 2,
wherein the first filter includes one of a stub and a resonator that is appended to a transfer line connected to the first filter and increases a selectivity of the first filter.

7. The mixer according to claim 3,
wherein the first filter includes one of a stub and a resonator that is appended to a transfer line connected to the first filter and increases a selectivity of the first filter.

8. The mixer according to claim 4,
wherein each first filter includes one of a stub and a resonator that is appended to a transfer line connected to the first filter and increases a selectivity of the first filter.

9. The mixer according to claim 5,
wherein each first filter includes one of a stub and a resonator that is appended to a transfer line connected to the first filter and increases a selectivity of the first filter.

10. The mixer according to claim 1,
further comprising an impedance converting circuit that inputs the multiplication signal and outputs the multiplication signal to an output transfer line at an output impedance that matches a characteristic impedance of the output transfer line and has an input impedance set higher than the output impedance.

11. The mixer according to claim 1,
wherein the magnetic field applying unit keeps the strength of the magnetic field constant.

12. A frequency converting apparatus comprising:
the mixer according to claim 1; and
a second filter operable when a high frequency out of the frequencies of the first high-frequency signal and the second high-frequency signal is set at f1 and a low frequency is set at f2, to pass one of multiplication signals with a frequency (f1+f2) and (f1−f2) out of the multiplication signals.

13. The frequency converting apparatus according to claim 12,
wherein the second filter is constructed of an amplifier whose upper limit frequency for an amplification operation is set between a frequency (f1−f2) of the multiplication signal and the frequency f2.

* * * * *